(12) United States Patent
Chen

(10) Patent No.: US 10,429,420 B1
(45) Date of Patent: Oct. 1, 2019

(54) SYSTEM FOR MEASURING AND MAPPING THE SHEET RESISTIVITY OF THE FILM ON FLAT-PANEL

(71) Applicant: James Chen, Hayward, CA (US)

(72) Inventor: James Chen, Hayward, CA (US)

( * ) Notice: Subject to any disclaimer, the term of this patent is extended or adjusted under 35 U.S.C. 154(b) by 0 days.

(21) Appl. No.: 15/984,154

(22) Filed: May 18, 2018

(51) Int. Cl.
*G01R 27/02* (2006.01)

(52) U.S. Cl.
CPC .................. *G01R 27/02* (2013.01)

(58) Field of Classification Search
CPC .............. G01N 27/041; G01R 31/2648; G01R 1/06744
See application file for complete search history.

(56) References Cited

U.S. PATENT DOCUMENTS

2008/0143354 A1* 6/2008 Chen .................. G01R 31/2648
324/715

2015/0061714 A1* 3/2015 Kelly-Morgan ....... G01N 27/00
324/754.11

* cited by examiner

*Primary Examiner* — Giovanni Astacio-Oquendo
*Assistant Examiner* — Alvaro E Fortich

(57) ABSTRACT

A system for measuring and mapping sheet resistivity of the film on flat-panel has a frame, a collection of leveling chucks, a probe-mounting assembly, and a collection of four-point probes. The probe-mounting assembly is a frame that holds the four-point probes in place. The leveling chucks and the probe-mounting assembly are mounted onto the frame, within the probe chamber. The flat panel is positioned in between the probe-mounting assembly and the leveling chucks. The sheet resistivity measurement by each of the collection of four-point probes can be done by electrical switching instead of mechanical repositioning and the flat panel transportation to and from the measurement position only needs to be done in one round trip instead of two, thus much time is saved. Also, the leveling chuck's speed in pressing the flat panel against the collection of four-point probes can be well controlled to avoid damaging of the flat panel.

12 Claims, 9 Drawing Sheets

SYSTEM FOR MEASURING AND MAPPING THE SHEET RESISTIVITY OF THE FILM ON FLAT-PANEL

FIELD OF THE INVENTION

The present invention relates generally to a sheet resistivity measurement and mapping tool. More particularly, the present invention relates to a device that uses a collection of stationary four-point probes and a collection of leveling chucks to measure and map the sheet resistivity of the film on flat-panels. The purpose of such an arrangement is for measuring sheet resistivity of the film on flat panel at multiple points while it is effectively on the end effector of the robot without laterally moving the flat panel while making multisite measurements and thus saving time for moving the flat panel and quality reducing the number of trips of the end effector.

BACKGROUND OF THE INVENTION

Traditional sheet resistivity measuring apparatuses rely on four-point probe that must be repositioned when measuring and mapping the sheet resistivity of a film on flat-panel. These devices make use of a single four-point probe that measures the sheet resistivity at various locations on the film on flat-panel. This methodology is limiting, because either the film on flat-panel or the four-point probe must be moved to accurate positions for accurately mapping the sheet resistivity of the film on flat-panel. Accordingly, the size and weight of the film on flat-panel mapping tool is a restrictive factor. Furthermore, this methodology for measuring sheet resistivity requires large amounts of time to create an accurate map of the film on flat-panel's sheet resistivity.

By employing an array of four-point probes, the present invention reduces the time, and size of the tool, required to measure and map sheet resistivity, thus improving upon the prior art. Furthermore, the present invention makes use of an array of leveling chucks that press the film on flat-panel against the array of four-point probes. Thus, enabling the tool to almost simultaneously measure the sheet resistivity of the flat panel electronic device at multiple positions. As a result, the present invention is able to measure the sheet resistivity of the film on flat-panels that vary in size and shape. Additionally, the present invention makes use of four-point probes that can be removed or replaced to measure disparate types of the film on flat-panels.

DETAIL DESCRIPTIONS OF THE INVENTION

All illustrations of the drawings are for the purpose of describing selected versions of the present invention and are not intended to limit the scope of the present invention.

As can be seen in FIG. 1 through FIG. 8, the preferred embodiment of the present invention, the system for measuring and mapping the sheet resistivity of the film on flat-panel, employs an array of four-point probes to measure sheet resistivity. To accomplish this, the present invention makes use of an array of four-point probes that are fixed in lateral place over an array of leveling chucks. In the preferred method of use of the present invention, a user first transports a flat-panel with film on it, using the end effector, to over the chucks then raises the leveling chucks to pass the level of the end effector, carrying the flat panel. Finally, the array of four-point probes almost simultaneously measures the sheet resistivity of the film at multiple locations on the flat-panel.

Figure 1:
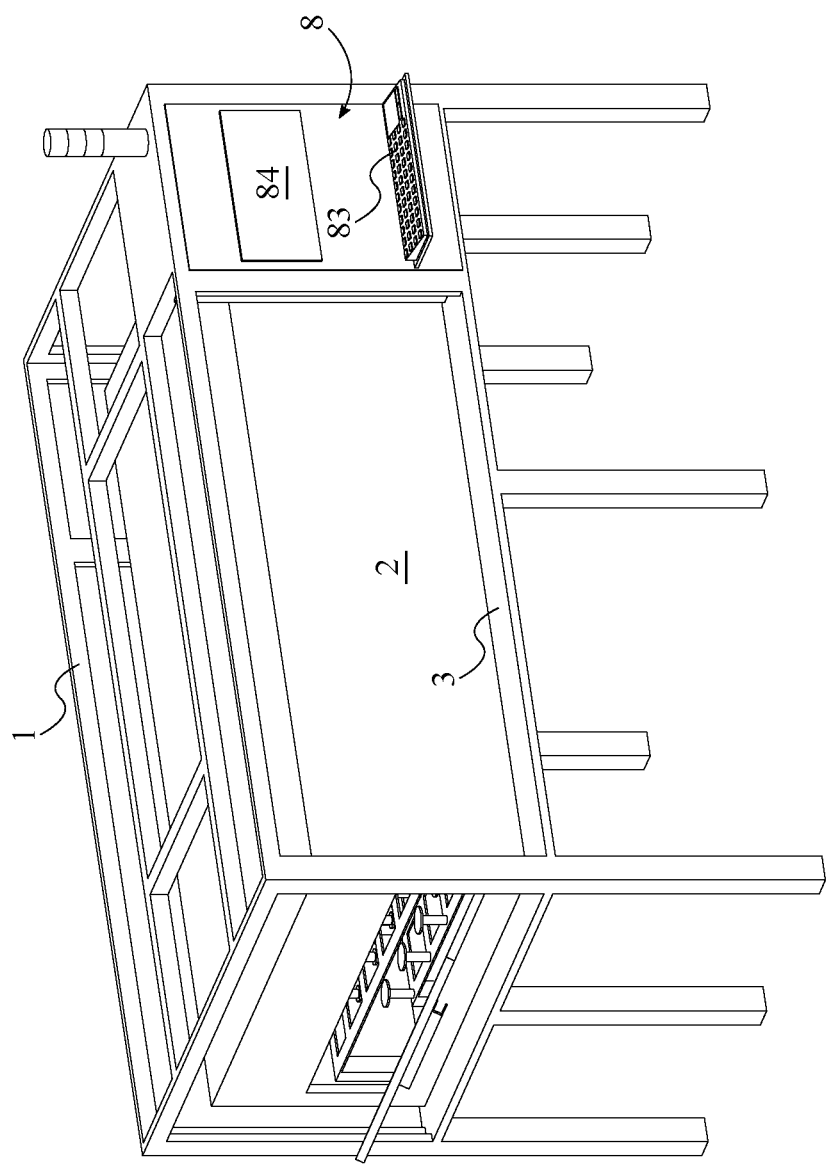
FIG. 1 is a perspective view of the present invention.
Figure 2:
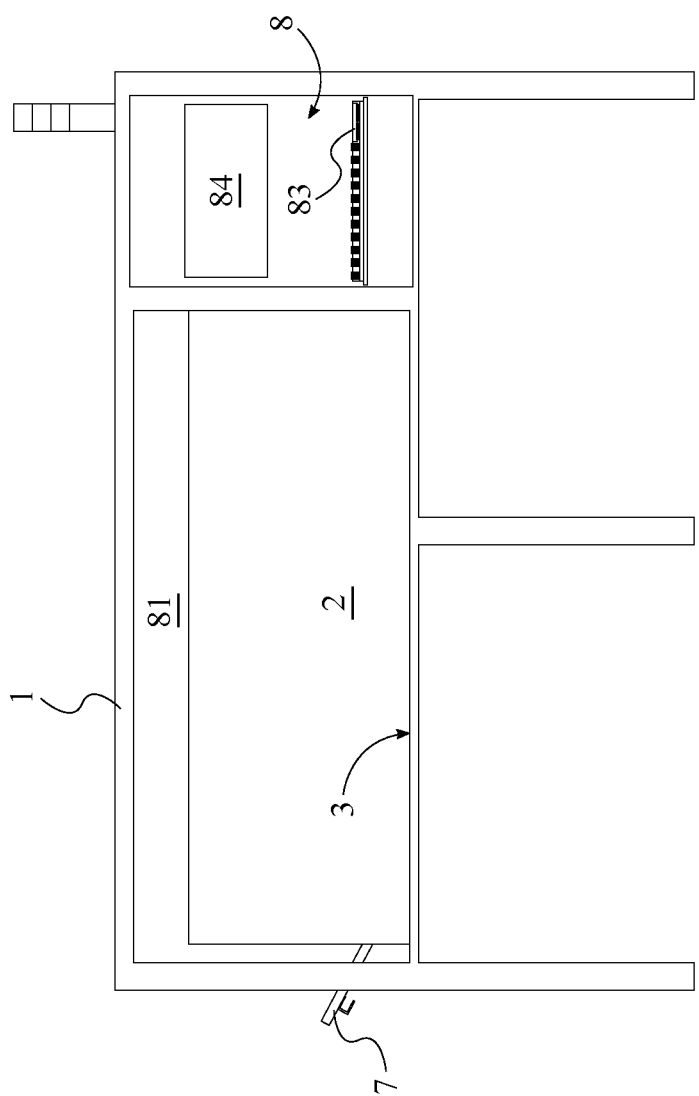
FIG. 2 is a front view of the present invention.
Figure 3:
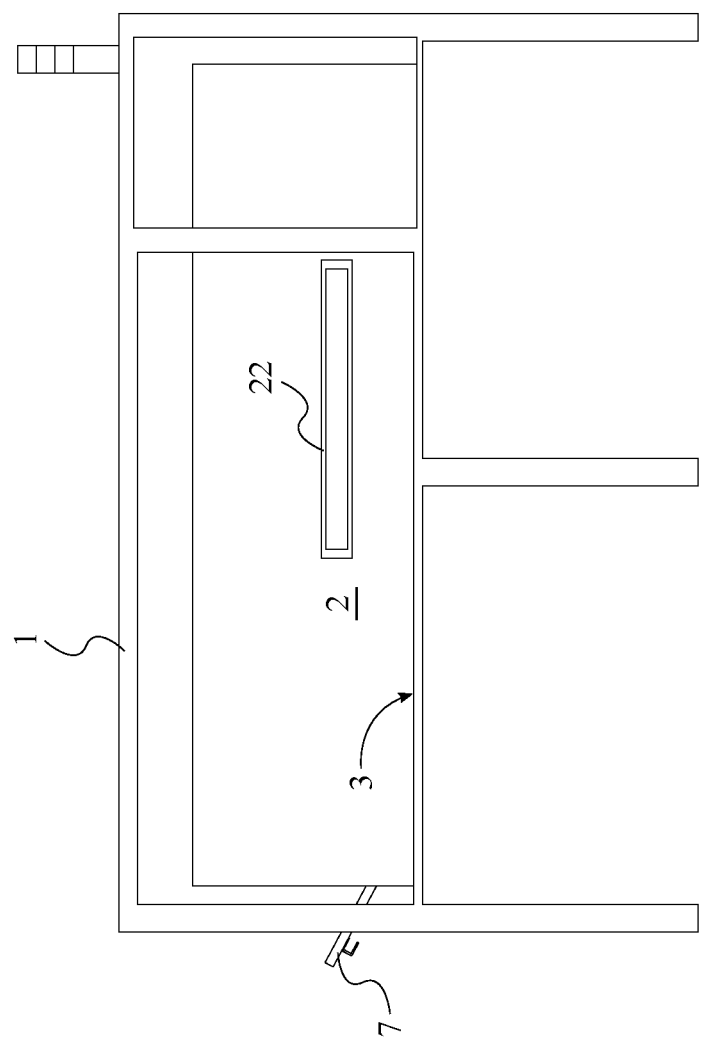
FIG. 3 is a rear view of the present invention.
Figure 4:
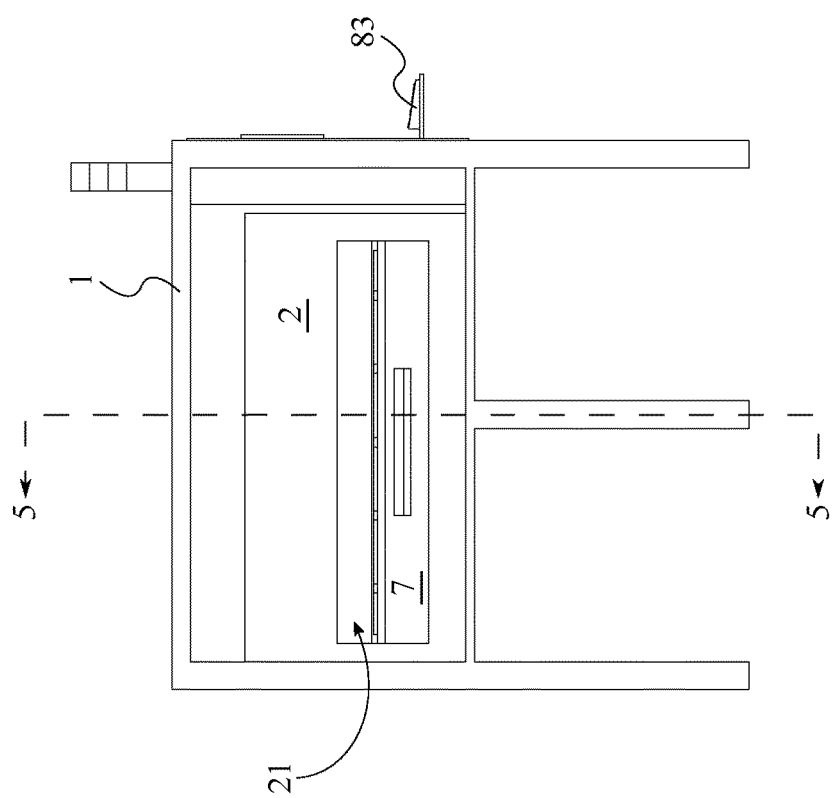
FIG. 4 is a left-side view of the present invention.
Figure 5:
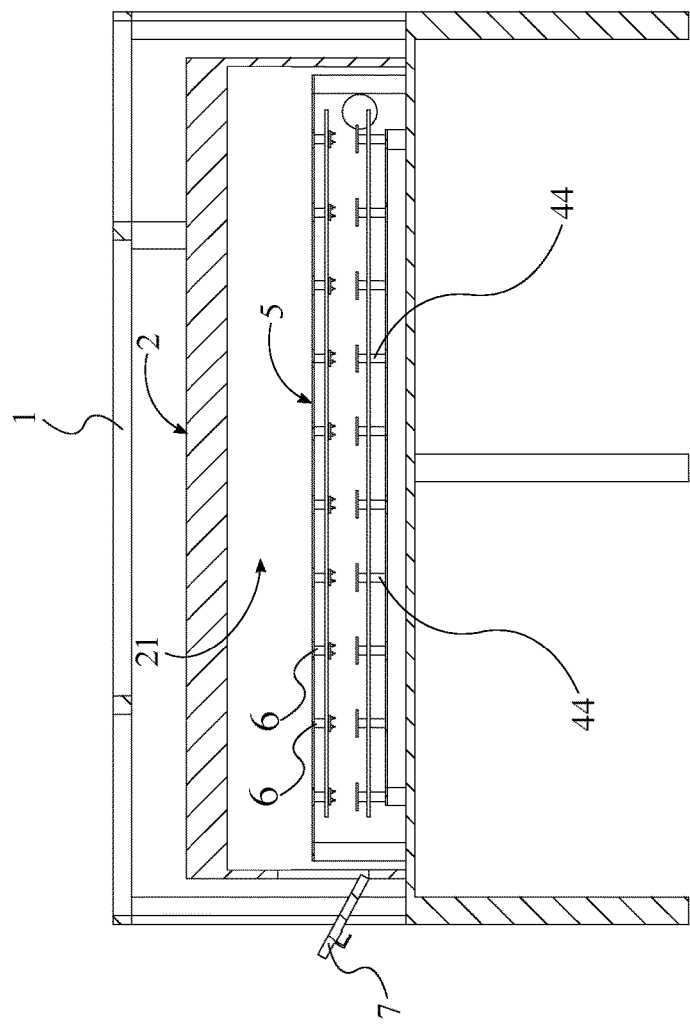
FIG. 5 is a sectional view of the present invention taken along line 5-5 in FIG. 4.

As can be seen in FIG. 1 and FIG. 5, the present invention makes use of an array of four-point probes that does not require the four-point probes to be repositioned when mapping sheet resistivity. To accomplish this, the present invention comprises a frame 1, a chamber 2, a base frame 3, a plurality of leveling chucks 4, a probe-mounting assembly 5, and a plurality of four-point probes 6. The frame 1 is a rigid structure onto which the remaining components of the present invention are mounted. Similarly, the base plate 3 is a planar surface that supports the components used to measure sheet resistivity. Further, the chamber 2 and the base frame 3 are mounted onto the frame 1. As a result, the chamber 2 and the flat-panel stage 3 are maintained in fixed positions while sheet resistivity is being measured. Additionally, the base frame 3 is positioned below the chamber 2. Accordingly, the base frame 3 functions as a platform that supports the components of the present invention that are housed within the chamber 2. In the present invention, the probe-mounting assembly 5 is a rigid frame that supports the plurality of four-point probes 6.

As can be seen in FIG. 1 and FIG. 5, the plurality of leveling chucks 4 on a plate supported by a piston and multiple shaft function in conjunction with the probe-mounting assembly 5 is mounted onto the frame 1. Accordingly, the components used to measure sheet resistivity can be exposed to the gas within the interior room 21 of the chamber 2, as appropriate. Specifically, the plurality of leveling chucks 4, the probe-mounting assembly 5, and the plurality of four-point probes 6 are probing on the flat-panel on the plurality of leveling chucks 4 and are housed within the chamber 2. As such, the plurality of leveling chucks 4 is distributed across the flat-panel. Consequently, each chuck in the plurality of leveling chucks 4 acts as a support that raises or lowers the flat-panel being measured. Additionally, each chuck in the plurality of leveling chucks 4 works in concert to coplanarize the flat-panel that is resting on the plurality of leveling chucks 4. That is, the plurality of leveling chucks 4 is used to reposition the flat-panel, such that the flat-panel is moved into a sufficiently level for probing with the probes. The plurality of four-point probes 6 is a collection of electrical probes, each of which includes four probing tips. The plurality of four-point probes 6 is detachably mounted onto the probe-mounting assembly 5 so that the user is able to replace or reposition each of the plurality of four-point probes 6 as desired. Additionally, the plurality of four-point probes 6 is positioned in between the plurality of leveling chucks 4 and the probe-mounting assembly 5. Furthermore, each of the plurality of four-point probes 6 is aligned to a corresponding chuck 44 from the plurality of leveling chucks 4 but is purposefully not aligned to the end effector. Accordingly, the plurality of leveling chucks 4 is able to press the coplanarized film on flat-panel against the plurality of four-point probes 6 when measuring sheet resistivity. Moreover, the plurality of four-point probes 6 and the plurality of leveling chucks 4 are configured to accurately map the sheet resistivity of the film on flat-panel.

As can be seen in FIG. 1, FIG. 2, FIG. 3, and FIG. 4, the chamber 2 is an enclosure that is designed to be attached to an external gas supplying tube. Further, the chamber 2 is designed to house the flat-panel while the plurality of four-point probes 6 measure sheet resistivity. The chamber 2 comprises a hatch 22 and an inlet-outlet valve 7. The hatch 22 is integrated into the chamber 2. Specifically, the hatch 22 is a door that enables the user to access the interior space 21 of the chamber 2 during probing. Conversely, the hatch 22 restricts access of light to the interior space 21 of the chamber 2 during probing. The user is able to insert the flat-panel into the interior space 21 of the chamber 2 through the hatch 22 Likewise, the user is able to extract the film on flat-panel from the interior cavity 21 of the chamber 2 through the hatch 22. The inlet-outlet valve 7 is integrated into the chamber 2. Additionally, the inlet-outlet valve 7 is in fluid communication with the interior space 21. Consequently, gas is able to be pumped into or sucked out of the interior space 21 of the chamber 2 through the inlet-outlet valve 7. Moreover, the external gas pipe is connected to the chamber 2 by the inlet-outlet valve 7. As a result, the external gas source is able to purge the interior s 21 of the chamber 2.

As can be seen in FIG. 1 to FIG. 8, the present invention is designed to be an automated system that not only measures and maps sheet resistivity, but also generates reports to visualize the gathered data. To accomplish this, the present invention comprises an electronic control unit (ECU) 8. The ECU 8 is a controller device that is designed to communicate with and control the electronic components of the present invention. To that end, the ECU 8 is laterally mounted in the frame 1. Thus positioned, the ECU 8 can be connected through a PCB to the plurality of four-point probes 6. Additionally, each of the plurality of leveling chucks 4 is electronically controlled by the ECU 8. Accordingly, the ECU 8 is able to dictate the operation of each of the plurality of four-point probes 6. Expounding on the descriptions of the ECU 8, the ECU 8 comprises a microcontroller 81 communicating to a central processing unit (CPU) 82, a control panel 83, and a display device 84. Additionally, the controller 81 is laterally mounted onto the frame 1 so that the ECU 8 is maintained in a fixed position relative to the plurality of leveling chucks 4 and the plurality of four-point probes 6. The CPU 82 is housed within a case 81 so that the CPU 82 is isolated from hazards in the external environment. The control panel 83 is a user interface that includes, but is not limited to, a keyboard, a mouse, and a set of dedicated command buttons. Additionally, the control panel 83 is laterally connected to the microcontroller 81 so that the user can easily access and interact with the control panel 83. The display device 84 is preferably a screen that visually outputs the sheet resistivity data that was gathered by the plurality of four-point probes 6. To facilitate visual inspection, the display device 84 is laterally connected to the CPU 82, adjacent to the control panel 83. As a result, the user is able to input commands, and view system information using the control panel 83 and the display device 84. As described above, each of the plurality of four-point probes 6 is electronically connected to the microcontroller 81. Accordingly, the microcontroller 81 is able to receive data from the plurality of four-point probes 6 and then direct them to the CPU 82.

Figure 7:
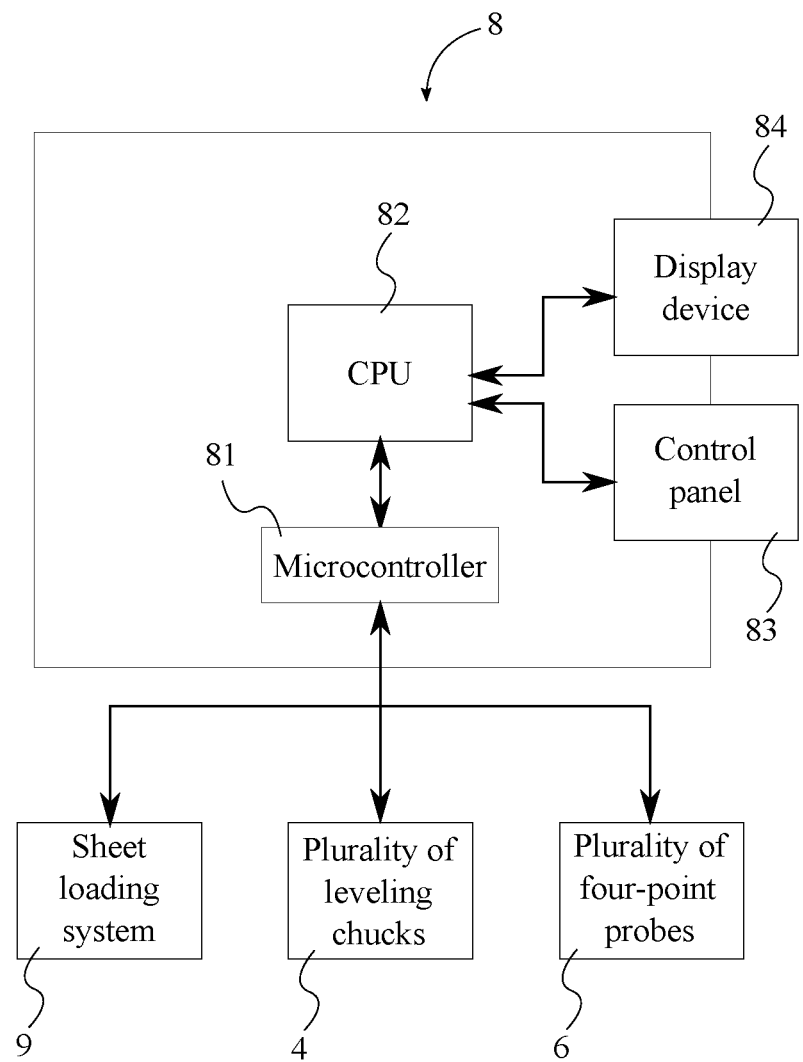
FIG. 7 is a schematic drawing showing the electronic connections between the components of the present invention.
Figure 8:
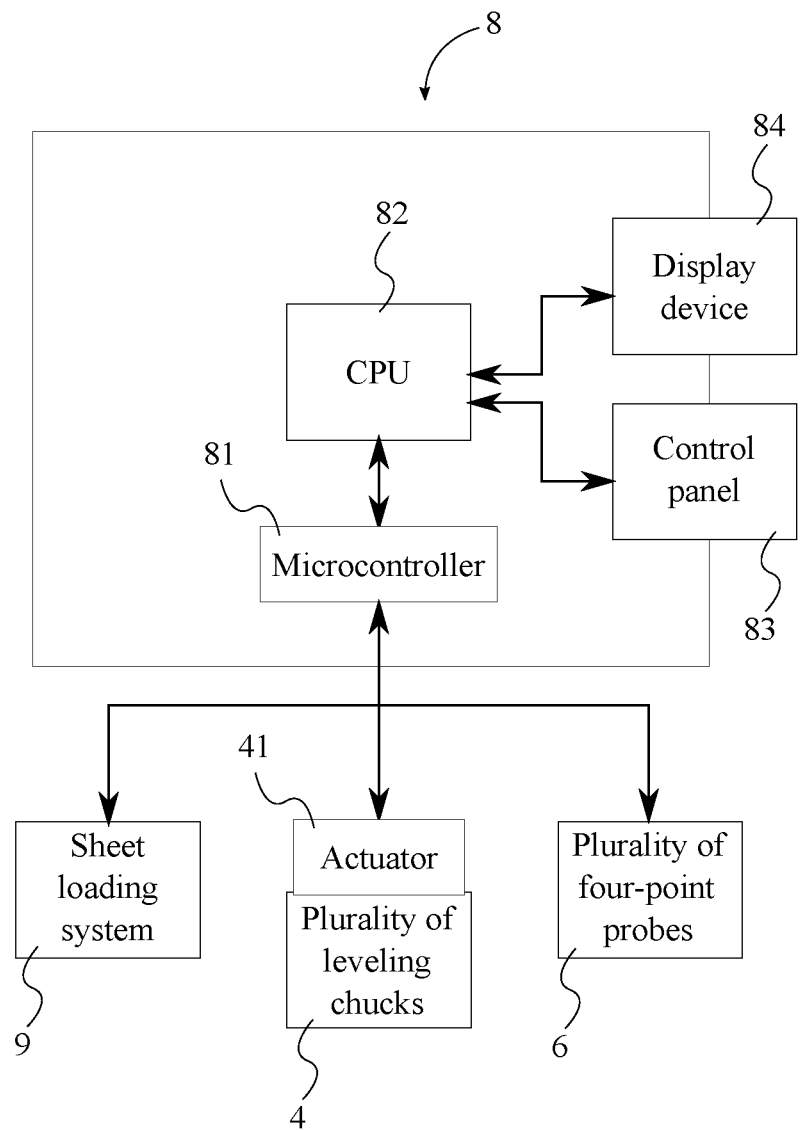
FIG. 8 is a schematic drawing showing the electronic connections between the components of an alternative embodiment of the present invention.

As can be seen in FIG. 1, FIG. 7, and FIG. 8, in the preferred embodiment of the present invention, each of the plurality of leveling chucks 4 is a self-contained system that is mounted on a flat plate that can perform lifting or lowering operations when directed by the ECU 8. To accomplish this, the flat plate is mounted on the actuator 41 and may be guided by a plurality of shafts. The actuator 41 is energized by compressed air and used to lift and lower the plurality of leveling chucks 4. Additionally, the actuator 41 is electronically controlled to the ECU 8. Thus connected, the ECU 8 is able to dictate how the electronic actuator 41 executes the lifting and lowering operations.

As can be seen in FIG. 1 and FIG. 7, the present invention is designed with an automated system for loading the flat-panel with film on it onto the plurality of leveling chucks 4 within the chamber 2. To that end, the present invention comprises a sheet-loading system 9. The sheet-loading system 9 is a device used to insert the flat-panel with film on it into the chamber 2. Additionally, the sheet-loading system 9 is the end effector of the robot mounted onto the robot arm so that the sheet-loading device can insert the flat-panel into the chamber 2 without damaging the flat-panel. Furthermore, the sheet-loading system 9 is positioned adjacent to the hatch 22 of the chamber 2. Accordingly, the sheet-loading system 9 is maintained in a position that facilitates inserting the film on flat-panel into the chamber 2. The sheet-loading system 9 is electronically controlled by the ECU 8. Thus, the ECU 8 is able to control the operation of the sheet-loading system 9 which can be a robot.

Figure 9:
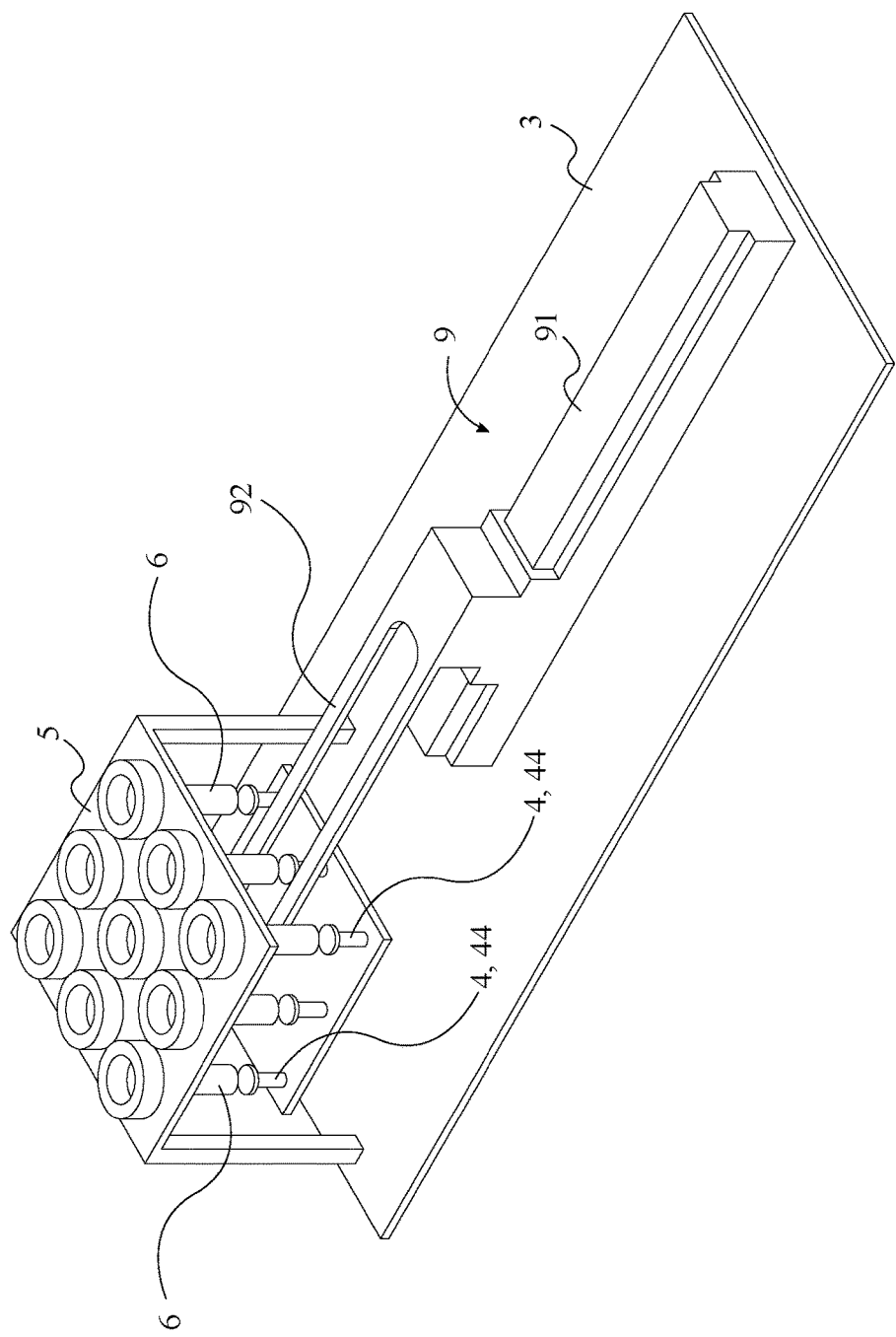
FIG. 9 is a perspective view of the end effector and the robotic arm used in the present invention.

As can be seen in FIG. 1, and FIG. 9, the sheet-loading system 9 is designed to manipulate the flat-panel prior to being loaded into the chamber 2 and after the sheet resistivity has been measured. To accomplish this, the sheet-loading system 9 comprises at least one robotic arm 91 and at least one end-effector 92. The end-effector 92 is terminally connected to a free end of the robotic arm 91 so that the end-effector 92 is able to manipulate the flat-panel. Conversely, the frame 1 is terminally linked to the robot 9, which is connected to the end-effector 92. Through the robotic arm 91 is maintained in a location that facilitates loading and unloading the flat-panel. In the first alternative embodiment of the present invention, the sheet-loading system robot 9 is a conveyor system.

Figure 6:
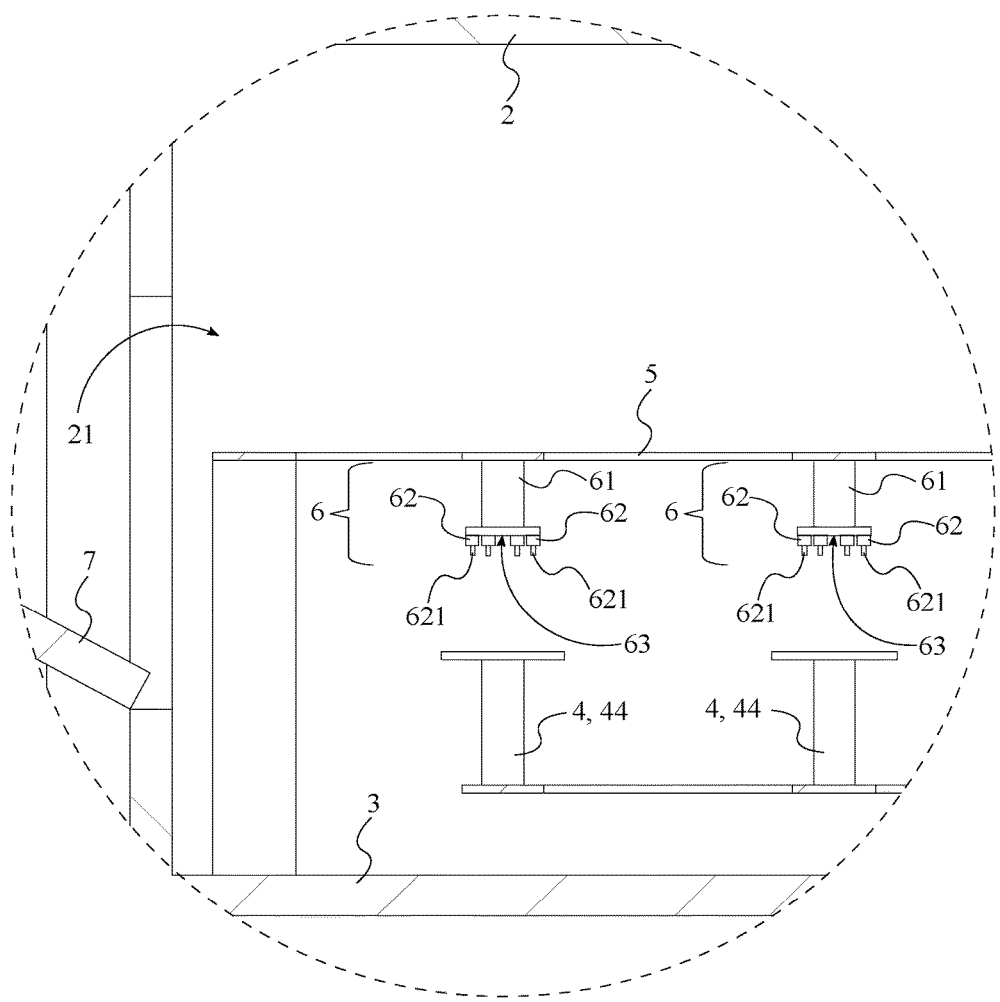
FIG. 6 is a magnified view of the present invention taken along line 6-6 in FIG. 5.

As can be seen in FIG. 1, FIG. 6, and FIG. 7, the present invention is designed with a plurality of four-point probes 6 that can be removed or replaced to measure the sheet resistivity of the film on flat-panel. To that end, each of the plurality of four-point probes 6 comprises a probe body 61 and a plurality of test probes 62. The probe body 61 is an intermediary connector that is used to retain the plurality of test probes 62 in an arrangement that facilitates measuring the sheet resistivity of the film on flat-panel. The plurality of test probes 62 is a collection of electrical test probes that are configured to measure the electrical properties of the film on flat-panel and known as a four-point probe. The probe body 61 is detachably mounted onto the probe-mounting assembly 5. Accordingly, the user can remove a single four-point probe 6 by detaching the probe body 61 from the probe-mounting assembly 5. Consequently, the plurality of test probes 62 is configured to facilitate measuring sheet resistivity. Moreover, a contact tip 621 for each of the plurality of test probes 62 is positioned coplanar to each other. Accordingly, the plurality of test probes 62 is able to accurately measure the sheet resistivity of the coplanarized film on flat-panel. In the preferred embodiment of the present invention, the contact tip 621 for each of the plurality of test probes 62 is configured with a contact curvature radius ranging between 40 micrometers and 500 micrometers. Additionally, the contact tip 621 for each of the plurality of test probes 62 is configured to measure film with sheet resistivity ranging between 1 milli-ohms per square and 8 giga-ohms per square. Furthermore, the contact tip 621 for each of the plurality of test probes 62 is made of tungsten carbide. Finally, the flat-panel on which the film is mounted is made of a non-conductive material.

Although the invention has been explained in relation to its preferred embodiment, it is to be understood that many other possible modifications and variations can be made without departing from the spirit and scope of the invention as hereinafter claimed.

What is claimed is:

1. A system for measuring and mapping a sheet resistivity of a film on a flat-panel comprising:
    a frame;
    a probe chamber;
    a horizontally tracking motion end effector for transporting the flat panel to a location for being probed;
    a plurality of leveling chucks for supporting the flat panel when being probed;
    a probe-mounting assembly;
    a plurality of four-point probes;
    the probe chamber and a chuck supporting plate being mounted onto the frame;
    the horizontally tracking motion end effector being tracked in and out of the probe chamber for transporting the flat panel to and from a probing position;
    the plurality of leveling chucks and the probe-mounting assembly being mounted in the probe chamber;
    the plurality of leveling chucks being distributed across the probe chamber on the chuck support plate;
    the plurality of leveling chucks being positioned in the probe chamber and under the probe-mounting assembly;
    the plurality of four-point probes being detachably mounted onto the probe-mounting assembly allowing only vertical movement;
    the plurality of four-point probes being positioned in between the plurality of leveling chucks and the probe mounting assembly;
    each of the plurality of four-point probes being pointing to a site of the corresponding chuck of the plurality of leveling chucks, this plurality of leveling chucks are positioned to avoid colliding with the horizontally tracking motion end effector when being lifted to meet a probe head.

2. The system for measuring and mapping the sheet resistivity of the film on flat-panel as claimed in claim 1 further comprising:
    a hatch;
    a gas inlet-outlet valve;
    the hatch being integrated into the probe chamber, wherein the hatch can keep the probe chamber filled with a conditioned air or gas;
    the inlet-outlet valve being integrated into the probe chamber.

3. The system for measuring and mapping the sheet resistivity of the film on flat panel as claimed in claim 1 further comprising:
    an electronic control unit (ECU);
    the ECU being mounted onto the frame;
    each of the plurality of leveling chucks and each of the plurality of four-point probes being electronically connected to the ECU.

4. The system for measuring and mapping the sheet resistivity of the film on flat panel as claimed in claim 3 further comprising:
    the ECU comprises a central processing unit (CPU), a control panel, and a display device;
    the CPU being housed within the frame;
    the control panel being mounted to the frame;
    the display device being connected to the CPU, adjacent to the control panel;
    the control panel and the display device being electronically connected to the CPU;
    each of the plurality of leveling chucks and each of the plurality of four-point probes being electronically connected to the ECU.

5. The system for measuring and mapping the sheet resistivity of the film on flat panel as claimed in claim 1 further comprising:
    an ECU;
    each of the plurality of leveling chucks can be lifted or lowered synchronously with the others by an actuator in conjunction with guiding shafts; the actuator for all of the plurality of leveling chucks being electronically controlled by the ECU.

6. The system for measuring and mapping the sheet resistivity of the film on flat panel as claimed in claim 3 further comprising:
    each of the plurality of leveling chucks and each of the plurality of four-point probes being electronically connected to the ECU.

7. The system for measuring and mapping the sheet resistivity of the film on flat panel as claimed in claim 1 further comprising:
    an ECU;
    a sheet-loading system;
    the sheet-loading system being mounted onto the frame;
    the sheet-loading system being positioned adjacent to a hatch of the probe chamber;
    the sheet-loading system being electronically controlled by the ECU.

8. The system for measuring and mapping the sheet resistivity of the film on flat panel as claimed in claim 7 further comprising:
    the sheet-loading system comprises at least one robotic arm and at least one end-effector;
    the end-effector being terminally connected to a free end of the robotic arm;
    the frame being terminally connected to a fixed end of the robotic arm, opposite to the end-effector.

9. The system for measuring and mapping the sheet resistivity of the film on flat panel as claimed in claim 1 further comprising:
    each of the plurality of four-point probes comprises a probe body and a plurality of test probes;
    the probe body being detachably mounted onto the probe-mounting assembly;
    a planar surface of the probe body being positioned opposite to the probe-mounting assembly;
    the plurality of test probes being penetrated through the planar surface of the probe body with jewels as guiding through holes;

the plurality of test probes being distributed across the planar surface of the probe body;

a contact tip for each of the plurality of test probes being positioned coplanar to each other.

10. The system for measuring and mapping the sheet resistivity of the film on flat-panel as claimed in claim 9, wherein the contact tip for each of the plurality of test probes can be configured with a contact tip with radius ranging between 40 micrometers and 500 micrometers.

11. The system for measuring and mapping the sheet resistivity of the film on flat-panel as claimed in claim 9, wherein the contact tip for each of the plurality of test probes is configured to measure film with sheet resistivity ranging between 1 milli-ohms per square and 8 giga-ohms per square.

12. The system for measuring and mapping the sheet resistivity of the film on flat panel as claimed in claim 9, wherein the contact tip for each of the plurality of test probes is made of tungsten carbide sheet resistivity measured are done in sequence by each probe in an array of the plurality of four-point probes through electronic switching instead of through mechanic repositioning a single four-point probe, thus much time is saved, also there is no need of the horizontally tracking motion end effector to move out of position while measuring, much time is saved in this way too.

* * * * *